(12) United States Patent
Wang et al.

(10) Patent No.: US 9,953,927 B1
(45) Date of Patent: Apr. 24, 2018

(54) LINER REPLACEMENTS FOR INTERCONNECT OPENINGS

(71) Applicant: GLOBALFOUNDRIES Inc., Grand Cayman (KY)

(72) Inventors: Yun-Yu Wang, Poughquag, NY (US); Daniel P. Stambaugh, Rhinebeck, NY (US); Jeffrey Brown, Hopewell Junction, NY (US); Keith Kwong Hon Wong, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/497,828

(22) Filed: Apr. 26, 2017

(51) Int. Cl.
*H01L 23/532* (2006.01)
*H01L 23/528* (2006.01)
*H01L 23/522* (2006.01)
*H01L 21/768* (2006.01)

(52) U.S. Cl.
CPC .. *H01L 23/53266* (2013.01); *H01L 21/76804* (2013.01); *H01L 21/76846* (2013.01); *H01L 21/76883* (2013.01); *H01L 23/5226* (2013.01); *H01L 23/5283* (2013.01); *H01L 23/53295* (2013.01)

(58) Field of Classification Search
CPC ............. H01L 23/5226; H01L 23/5283; H01L 23/53266; H01L 23/53295
See application file for complete search history.

(56) References Cited

U.S. PATENT DOCUMENTS

| | | | |
|---|---|---|---|
| 5,926,737 A | 7/1999 | Ameen et al. | |
| 6,093,645 A | 7/2000 | Ameen et al. | |
| 6,443,743 B1 | 9/2002 | Saran | |
| 7,323,409 B2 | 1/2008 | Griffin, Jr. et al. | |
| 7,407,875 B2 | 8/2008 | Wong et al. | |
| 2006/0121733 A1* | 6/2006 | Kilpela | C23C 16/18 438/681 |
| 2007/0004201 A1* | 1/2007 | Lubomirsky | C23C 18/38 438/678 |
| 2007/0238288 A1* | 10/2007 | Suzuki | C23C 16/16 438/652 |

* cited by examiner

*Primary Examiner* — Peniel M Gumedzoe
(74) *Attorney, Agent, or Firm* — Thompson Hine LLP; Anthony Canale

(57) ABSTRACT

Structures for a liner replacement in an interconnect structure and methods for forming a liner replacement in an interconnect structure. A metallization level is formed that includes a conductive feature. A dielectric layer is formed on the metallization level. The dielectric layer includes an opening that extends vertically through the dielectric layer to the conductive feature. An adhesion layer is formed on area of the conductive feature exposed at a base of the opening. The adhesion layer has a thickness equal to a monolayer or a fraction of a monolayer. Another layer (e.g., barrier layer) of a different composition (e.g., TiN) may be deposited on the adhesion layer before the opening is filled with metal deposited by chemical vapor deposition.

20 Claims, 2 Drawing Sheets

LINER REPLACEMENTS FOR INTERCONNECT OPENINGS

BACKGROUND

The present invention relates to semiconductor device fabrication and integrated circuits and, more specifically, to structures for a liner replacement in an interconnect structure and methods for forming a liner replacement in an interconnect structure.

Device structures may be fabricated on a substrate by front-end-of-line (FEOL) processing and an interconnect structure fabricated by middle-of-line (MOL) processing and back-end-of-line (BEOL) processing may be used to connect the FEOL device structures. The metallization levels of an interconnect structure may include openings formed in a dielectric layer and filled with metal to form wires and contacts.

A liner may be applied to the surfaces of the openings before the primary metal is deposited. For high aspect ratio openings in advanced technologies, the liner may fail to adequately protect these surfaces during a metal deposition process that relies on a halogen-based reactant. For example, tungsten hexafluoride is a common reactant used to deposit tungsten by chemical vapor deposition. The fluorine liberated during deposition may react with the liner metal to form a metal-fluorine complex. The metal-fluorine complex is retained in the device structure and, over time, may cause damage and even result in failures.

Improved structures for a liner replacement in an interconnect structure and methods for forming a liner replacement in an interconnect structure are needed.

SUMMARY

In an embodiment of the invention, a structure includes a metallization level with a conductive feature and a dielectric layer on the metallization level. The dielectric layer includes an opening extending vertically through the dielectric layer on the conductive feature. The opening has a base that exposes an area on the conductive feature. A layer is applied on the area of the first conductive feature. The layer is comprised of a conductor, and has a thickness equal to a monolayer or a fraction of a monolayer.

In an embodiment of the invention, a method includes forming a metallization level that includes a conductive feature, forming a dielectric layer on the metallization level, and forming an opening in the dielectric layer that extends vertically through the dielectric layer to the conductive feature. The method further includes forming a layer on an area of the conductive feature exposed at a base of the opening. The layer is comprised of a conductor, and the layer has a thickness equal to a monolayer or a fraction of a monolayer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
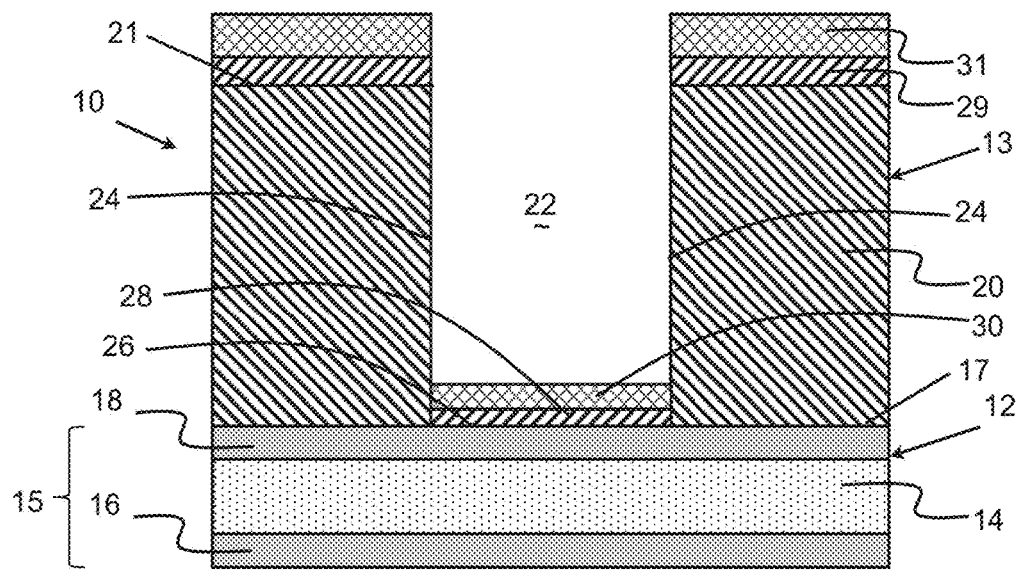
FIGS. 1-3 are cross-sectional views of a structure at successive fabrication stages of a processing method in accordance with embodiments of the invention.
Figure 1A:
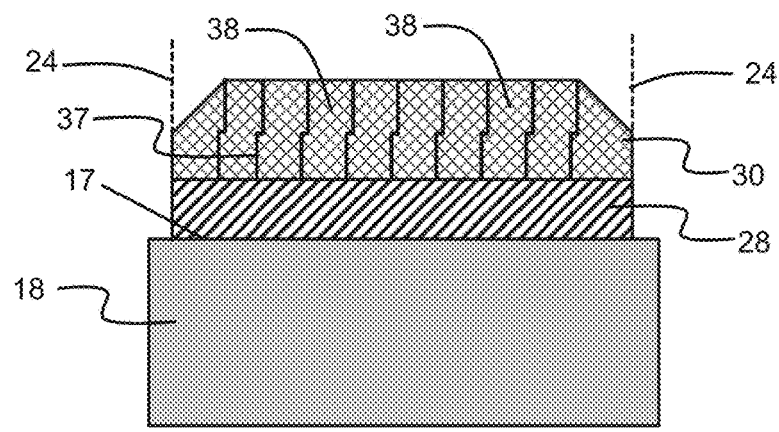
FIG. 1A is an enlarged view of a portion of FIG. 1.

With reference to FIGS. 1, 1A and in accordance with embodiments of the invention, an interconnect structure 10 includes a representative metallization level 12 that may be formed by a middle-of-line (MOL) or back-end-of-line (BEOL) process on a substrate following the completion of FEOL processing. The representative metallization level 12 includes a dielectric layer (not shown) and a conductive feature 15 that is embedded in the dielectric layer. Additional metallization levels (not shown) of the interconnect structure may be formed below the metallization level 12. The different metallization levels of the interconnect structure 10 function to interconnect devices of an integrated circuit and may provide circuit-to-circuit connections, or may establish contacts with input and output terminals.

The conductive feature 15 includes a metal line 14 that is clad on a lower surface by a liner 16 and that is clad on an upper surface by a liner 18. The metal line 14 may be comprised of a conductor, such as aluminum (Al) or copper (Cu), formed by deposition and subtractive etching or by a damascene process. The liners 16, 18 may be comprised of titanium (Ti), titanium nitride (TiN), tantalum (Ta), tantalum nitride (TaN), or a layered combination of these materials (e.g., a bilayer of TiN/Ti) deposited by physical vapor deposition (PVD).

A dielectric layer 20 is applied on the top surface 17 of the conductive feature 15 and may constitute a portion of a metallization level 13 of the interconnect structure 10 that overlies the metallization level 12. The dielectric layer 20 may be comprised of an electrically-insulating dielectric material, such as an oxide of silicon (e.g., silicon dioxide ($SiO_2$)) deposited by CVD or a low-k dielectric material characterized by a dielectric constant (i.e., relative permittivity) that is less than the dielectric constant of silicon dioxide ($SiO_2$).

An opening 22 is formed in the dielectric layer 20 that penetrates vertically through the dielectric layer 20. In an embodiment, the opening 22 may have a high aspect ratio of depth to width, such as an aspect ratio of 4:1. The opening 22 may be formed by an etching process, such as reactive ion etching (RIE), with an etch mask applied to a top surface 21 of the dielectric layer 20.

The opening 22 may have the dimensions and shape characteristic of a via, a contact hole, a trench, etc. The opening 22 has sidewalls 24 that extend vertically from the top surface 21 of the dielectric layer 20 to intersect with the top surface 17 of the conductive feature 15. The sidewalls 24 of the opening 22 may be aligned substantially vertical as in the representative embodiment or may have a degree of tapering that converges with increasing distance in a direction from the top surface 21 of the dielectric layer 20 to the top surface 17 of the conductive feature 15. The opening 22 has a bottom or base 26 that connects the sidewalls 24 at respective corners of intersection, and is bordered by the dielectric layer 20 at its sidewalls 24. The base 26 of the opening 22 exposes an area on the top surface 17 of the conductive feature 15.

An adhesion layer 28 and a barrier layer 30 are applied as components of a layer stack on the conductive feature 15 across the area exposed on its top surface 17 at the base 26 of the opening 22. The layers 28, 30 are formed before the opening 22 in the dielectric layer 20 is filled with the primary electrical conductor, and the adhesion layer 28 is formed before the barrier layer 30. Layers 29 and 31, which are respectively constituted by the same materials as layers 28 and 30, also deposit on the top surface 21 of the dielectric layer 20.

The adhesion layer 28 is arranged in direct contact with the conductive feature 15. The barrier layer 30 is arranged in direct contact with the adhesion layer 28. Neither of the layers 28,30 is in contact with the dielectric layer 20 other than at and near the corners where the sidewalls 24 of the opening 22 intersect the base 26 of the opening 22. Otherwise, the sidewalls 24 of the opening 22 are free of the respective materials of the layers 28, 30 or only a negligible thickness is formed on the sidewalls 24 when the layers 28, 30 are deposited.

In an embodiment, the adhesion layer 28 may be comprised of an elemental metal when deposited, and the barrier layer 30 may be comprised of a compound or alloy that is a solid mixture of two or more elements. In an embodiment, the adhesion layer 28 may be comprised of titanium (Ti) deposited by a directional deposition technique, such as physical vapor deposition (PVD) with a sputtering process. Due at least in part to the selection of deposition technique, the adhesion layer 28 does not deposit on the sidewalls 24 or only deposits on the sidewalls 24 with a negligible thickness.

The barrier layer 30 may be comprised of a metal, such as titanium nitride (TiN) deposited by PVD of titanium in the presence of a nitrogen gas flow or by CVD with a titanium-based reactant in the presence of a nitrogen-based reactant. Due at least in part to the selection of deposition technique, the barrier layer 30 does not deposit on the sidewalls 24 or only deposits on the sidewalls 24 with a negligible thickness. In an alternative embodiment, the barrier layer 30 may be comprised of a tungsten (W) deposited by physical vapor deposition (PVD) with, for example, a sputtering process.

As best shown in FIG. 1A, the barrier layer 30 may include columnar grains 38 that extend vertically through the thickness of the barrier layer 30 and that include grain boundaries 37 between adjacent grains 38. The columnar grains 38 are the result of the deposition technique used for forming the barrier layer 30. The inclusion of grains 38 may reduce the quality of the coverage of the adhesion layer 28 by the barrier layer 30. The barrier layer 30 may also have a non-uniform thickness, which may further reduce the quality of the coverage of the adhesion layer 28 by the barrier layer 30. At the bottom corners of the opening 22 near the sidewalls 24, the coverage of the barrier layer 30 may be particularly poor, which may reduce the ability of the barrier layer 30 to function as a barrier to, for example, the diffusion of oxygen and fluorine.

The thickness, t1, of adhesion layer 28 on the area on the top surface 17 of the conductive feature 15 at the base 26 of the opening 22 is less than the thickness, t2, of the barrier layer 30 across the same area. The thickness of the adhesion layer 28 on the area on the top surface of the conductive feature 15 at the base 26 of the opening 22 may be equal to a fraction of a monolayer or a single monolayer (i.e., 0.5 nanometer to 1.0 nanometers). In contrast, the barrier layer 30 may be considerably thicker with a thickness in a range of, for example, five (5) nanometers to ten (10) nanometers.

The layers 29, 31 that are deposited on the top surface 21 of the dielectric layer 20 may be thicker than the layers 28, 30 that are deposited on the conductive feature 15 at the base 26 of the opening 22. The thickness difference may be due, at least in part, to the opening 22 having a high aspect ratio.

In an embodiment, the thickness of the adhesion layer 28 on the top surface 21 of the dielectric layer 20 may be on the order of ten (10) nanometers, and the thickness of the barrier layer 30 on the top surface 21 of the dielectric layer 20 may be twenty-five (25) nanometers to fifty (50) nanometers.

Figure 2:
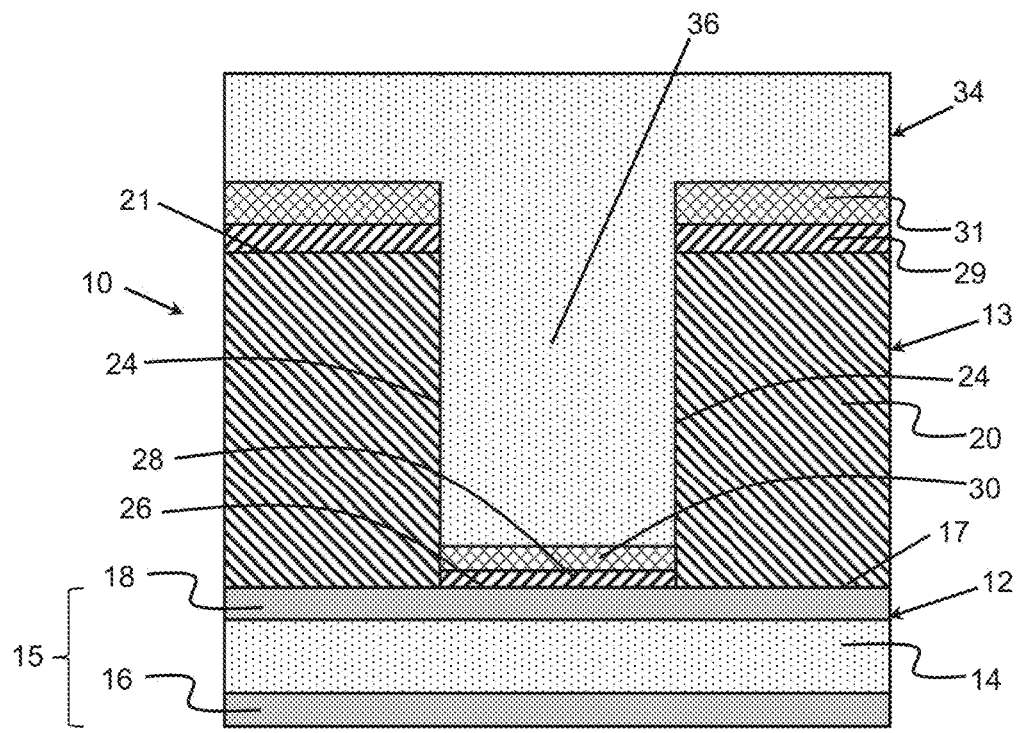

With reference to FIG. 2 in which like reference numerals refer to like features in FIG. 1 and at a subsequent fabrication stage, a conductor layer 34 is deposited that contributes to forming a conductive feature 36 inside the opening 22. The conductor layer 34 may be comprised of a metal, such as tungsten (W), that is deposited on a heated substrate as a solid material by a chemical vapor deposition (CVD) process from one or more reactants in the vapor phase. The precursor source used during CVD as a reactant to deposit the metal of the conductor layer 34 may contain a halogen, such as fluorine (F), and may be reacted with a reducing gas containing hydrogen. For example, tungsten may be deposited by CVD using a precursor source comprised of a tungsten halide, such as tungsten hexafluoride ($WF_6$). The deposition of the conductor layer 34 may be a multiple step process that involves the deposition of a nucleation layer inside the opening 22 followed by the deposition of a bulk fill layer. The conductor layer 34 also overfills the opening 22 and forms on the layers 29, 31 covering the top surface 21 of the dielectric layer 20. The conductive feature 36 is located at a level inside the opening 22 that is at or below the level of the layer 29.

Figure 3:
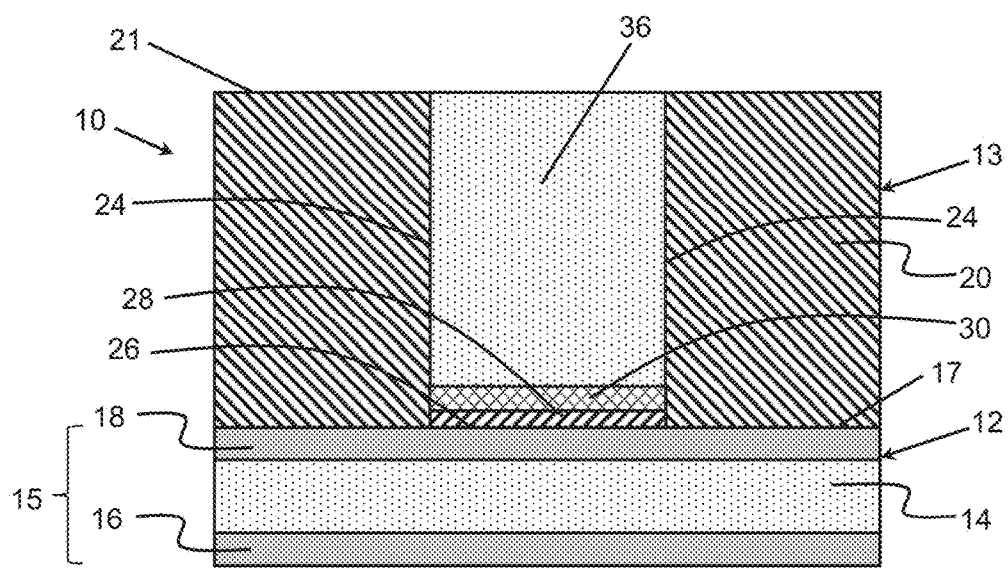

With reference to FIG. 3 in which like reference numerals refer to like features in FIG. 2 and at a subsequent fabrication stage, a chemical mechanical polishing (CMP) process may be used to remove the layers 29, 31, 34 from the top surface 21 and to planarize the conductor layer 34. Material removal during the chemical mechanical polishing process combines abrasion and an etching effect that polishes and removes the targeted materials of layers 29, 31, 34. The conductive feature 36 remains inside the opening 22 and is coupled with the conductive feature 15 at the base 26 of the opening 22. The adhesion layer 28 and the barrier layer 30 are intervening structures that are positioned between the conductive feature 36 and the conductive feature 15.

Prior to the deposition of the conductor layer 34, the metal in the adhesion layer 28 at the base 26 of the opening 22 is chemically bound with another element so that the metal of the adhesion layer 28 is not free and chemically reactive. For example, the metal contained in the adhesion layer 28 may be bound with oxygen from absorbed oxygen on the conductive feature 15 prior to the deposition of adhesion layer 28. For example, the metal titanium (Ti) has a high affinity for oxygen and, thus, elemental titanium in the adhesion layer 28 readily combines with oxygen either absorbed on the conductive feature 15 at the base 26 of the opening 22 or present in a native surface oxide on the conductive feature 15 at the base 26 of the opening 22. Because of its small thickness in comparison with conventional liner arrangements, the reactive metal of the adhesion layer 28 does not contain free metallic titanium that is available for participating in chemical reactions.

Reaction by-products, such as a halogen (e.g., fluorine), are produced and liberated by the CVD reaction forming the conductor layer 34. The chemical inertness of the adhesion layer 28 operates to prevent atoms or molecules of these reaction by-products from collecting at the base 26 of the opening 22, and in particular from accumulating at the corners of the opening 22 at the base 26. Specifically, the binding of the metal (e.g., titanium) in the adhesion layer 28 with another element (e.g., oxygen) may prevent the metal from reacting with the halogen (e.g., fluorine) originating from the CVD reaction. The elimination of free metal atoms (e.g., atoms of titanium) in the adhesion layer 28 at the interface with the conductive feature 15, prior to deposition of the conductor layer 34, may prevent the formation of halogen-containing chemical complexes, such as chemical complexes like $TiF_x$ containing fluorine. The absence of halogen-containing chemical complexes associated with the at the corners of the opening 22, and the interface with the conductive feature 15, may lower the contact resistance and may reduce reliability issues from corrosion.

Conventional barrier layers function to protect conventional adhesion layers from being oxidized while open to air exposure and to block fluorine from penetrating through the barrier layer to react with titanium in the adhesion layer. In embodiments of the invention, the adhesion layer 28, which has a significantly reduced thickness in comparison with conventional barrier layers, lacks free metal (e.g., Ti) that is available to react with fluorine, or another halogen, produced by a CVD reaction. Fluorine, or another halogen, is permitted to pass through the barrier layer 30, but cannot react with the adhesion layer 28. In contrast with conventional barrier layers, the barrier layer 30 does not have to function as a barrier that prevents fluorine penetration. The barrier layer 30 also functions at least in part to prevent the adhesion layer 28 from being further oxidized, when reacted with oxygen, beyond its initial oxidation state, which could increase its electrical resistance.

Because the adhesion layer 28 is formed by a directional deposition process and material from the adhesion layer 28 does not form on the sidewalls 24 of the opening 22 during deposition, the size of the conductive feature 36 is larger than in conventional processes in which a liner layer is formed by a conformal deposition process would cover the sidewalls 24 of the opening 22. A layer formed by a conformal deposition process has a thickness that is approximately constant and independent of the geometry of coated features. The layers 28, 30 replace a conventional liner that would cover the sidewalls 24 of the opening 22.

In embodiments, the presence of the adhesion layer 28 may permit the barrier layer 30 to be formed with a lower quality (e.g., lower coverage). For example, the barrier layer 30 may be deposited by a directional process (e.g., PVD) that forms films with the columnar grains 38 (FIG. 1A). Similar to the adhesion layer 28, the material forming the barrier layer 30 does not form on the sidewalls 24 of the opening 22 in dielectric layer 20 because the directional deposition process depositing the barrier layer 30 is non-conformal.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a metallization level including a first conductive feature;
   a dielectric layer on the metallization level, the dielectric layer including an opening extending vertically through the dielectric layer on the first conductive feature, and the opening having a base that exposes an area on the first conductive feature;
   a first layer on the area of the first conductive feature, the first layer comprised of a conductor that includes titanium and oxygen, and the first layer having a thickness equal to a monolayer or a fraction of a monolayer; and
   a second conductive feature in the opening, the second conductive feature comprised of tungsten,
   wherein the first layer is arranged vertically between the second conductive feature and the first conductive feature.

2. The structure of claim 1 wherein the first layer is in direct contact with the first conductive feature in the metallization level.

3. The structure of claim 1 wherein the opening is bounded by sidewalls extending from a top surface of the dielectric layer to a top surface of the first conductive feature, and the sidewalls of the opening between the first layer and the top surface of the dielectric layer are free of the first layer such that the first layer is only located on the area of the first conductive feature.

4. The structure of claim 1 further comprising:
   a second layer between the first layer and the second conductive feature,
   wherein the second layer has a thickness that is greater than the thickness of the first layer.

5. The structure of claim 4 wherein the opening is bounded by sidewalls extending from a top surface of the dielectric layer to a top surface of the first conductive feature, and the sidewalls of the opening between the first layer and the top surface of the dielectric layer are free of the first layer such that the first layer is only located on the area of the first conductive feature.

6. The structure of claim 5 wherein the second layer has a non-uniform thickness that is thinnest at corners of the opening near the sidewalls.

7. The structure of claim 4 wherein the second layer is comprised of tungsten.

8. The structure of claim 4 wherein the second layer is comprised of titanium nitride.

9. The structure of claim 4 wherein the second layer has a thickness in a range of five nanometers to ten nanometers.

10. The structure of claim 4 wherein the second layer includes a plurality of columnar grains and a plurality of grain boundaries between the grains.

11. The structure of claim 1 wherein the opening is bounded by sidewalls, and the second conductive feature is in direct contact with the dielectric layer at the sidewalls of the opening.

12. The structure of claim 1 wherein the opening is a contact opening.

13. A method comprising:
forming a metallization level that includes a first conductive feature;
forming a dielectric layer on the metallization level;
forming an opening in the dielectric layer that extends vertically through the dielectric layer to the first conductive feature;
forming a first layer on an area of the first conductive feature that is exposed at a base of the opening; and
forming a second conductive feature in the opening,
wherein the first layer is comprised of a conductor including titanium and oxygen, the first layer is vertically between the second conductive feature and the first conductive feature, the second conductive feature is comprised of tungsten, and the first layer has a thickness equal to a monolayer or a fraction of a monolayer.

14. The method of claim 13 wherein the opening is bounded by sidewalls extending from a top surface of the dielectric layer to a top surface of the first conductive feature, and the first layer is formed with a directional deposition process such that the sidewalls of the opening between the first layer and the top surface of the dielectric layer are free of the first layer and the first layer is only located on the area of the first conductive feature.

15. The method of claim 13 wherein the first layer is in direct contact with the first conductive feature in the metallization level.

16. The method of claim 13 further comprising:
forming a second layer between the first layer and the second conductive feature,
wherein the second layer has a thickness that is greater than the thickness of the first layer.

17. The method of claim 16 wherein the opening is bounded by sidewalls extending from a top surface of the dielectric layer to a top surface of the first conductive feature, and the sidewalls of the opening between the first layer and the top surface of the dielectric layer are free of the first layer such that the first layer is only located on the area of the first conductive feature.

18. The method of claim 16 wherein the second layer is comprised of titanium nitride deposited by physical vapor deposition.

19. The method of claim 16 wherein the second layer is comprised of tungsten deposited by physical vapor deposition.

20. The method of claim 13 wherein the opening is bounded by sidewalls, and the second conductive feature is in direct contact with the dielectric layer at the sidewalls of the opening.

* * * * *